US008237496B2

(12) United States Patent
Jiang et al.

(10) Patent No.: US 8,237,496 B2
(45) Date of Patent: Aug. 7, 2012

(54) SWITCHING AMPLIFIER WITH ENHANCED SUPPLY REJECTION AND RELATED METHOD

(75) Inventors: Xicheng Jiang, Irvine, CA (US); Jungwoo Song, Irvine, CA (US); Minsheng Wang, Irvine, CA (US); Todd L. Brooks, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 21 days.

(21) Appl. No.: 12/804,834

(22) Filed: Jul. 29, 2010

(65) Prior Publication Data

US 2012/0025910 A1 Feb. 2, 2012

(51) Int. Cl.
*H03F 3/38* (2006.01)

(52) U.S. Cl. ....................... 330/10; 330/295; 330/207 A

(58) Field of Classification Search .................... 330/10, 330/251, 207 A See application file for complete search history.

(56) References Cited

U.S. PATENT DOCUMENTS 6,952,131 B2 * 10/2005 Jeong et al. .................... 330/10

* cited by examiner

*Primary Examiner* — Robert Pascal
*Assistant Examiner* — Khiem Nguyen
(74) *Attorney, Agent, or Firm* — Farjami & Farjami LLP

(57) ABSTRACT

Disclosed is a switching amplifier having an enhanced supply rejection. The switching amplifier comprises a digital modulator that provides a modulated signal. The switching amplifier further comprises a closed-loop analog driver that is coupled to the digital modulator. As disclosed, the closed-loop analog driver is configured to re-modulate a modulation signal that corresponds to the modulated signal. An output stage of the switching amplifier is driven by the re-modulated signal, thereby providing enhanced supply rejection. In one embodiment, the modulated signal is produced by a digital pulse-width modulator (PWM) circuit of a Class-D amplifier, and has a pulse rate substantially less than a clock rate of the digital PWM circuit. In one embodiment, the switching amplifier is implemented as an audio amplifier in a mobile communication device such as a cellular telephone.

20 Claims, 4 Drawing Sheets

200
202
212
214 Digital Loop Filter
216
218 Oscillator fosc
213
217
fs
210 Digital PWM
219
222
229a
224a Feed-Forward Stage
227
224c Pulse Width Re-Modulator
232
230 Switching Output Stage
242
240 Load
221
229b
225
226 Analog Loop Filter
224b
223
Feedback Stage
220 Closed-Loop Analog Driver
Switching Amplifier 204

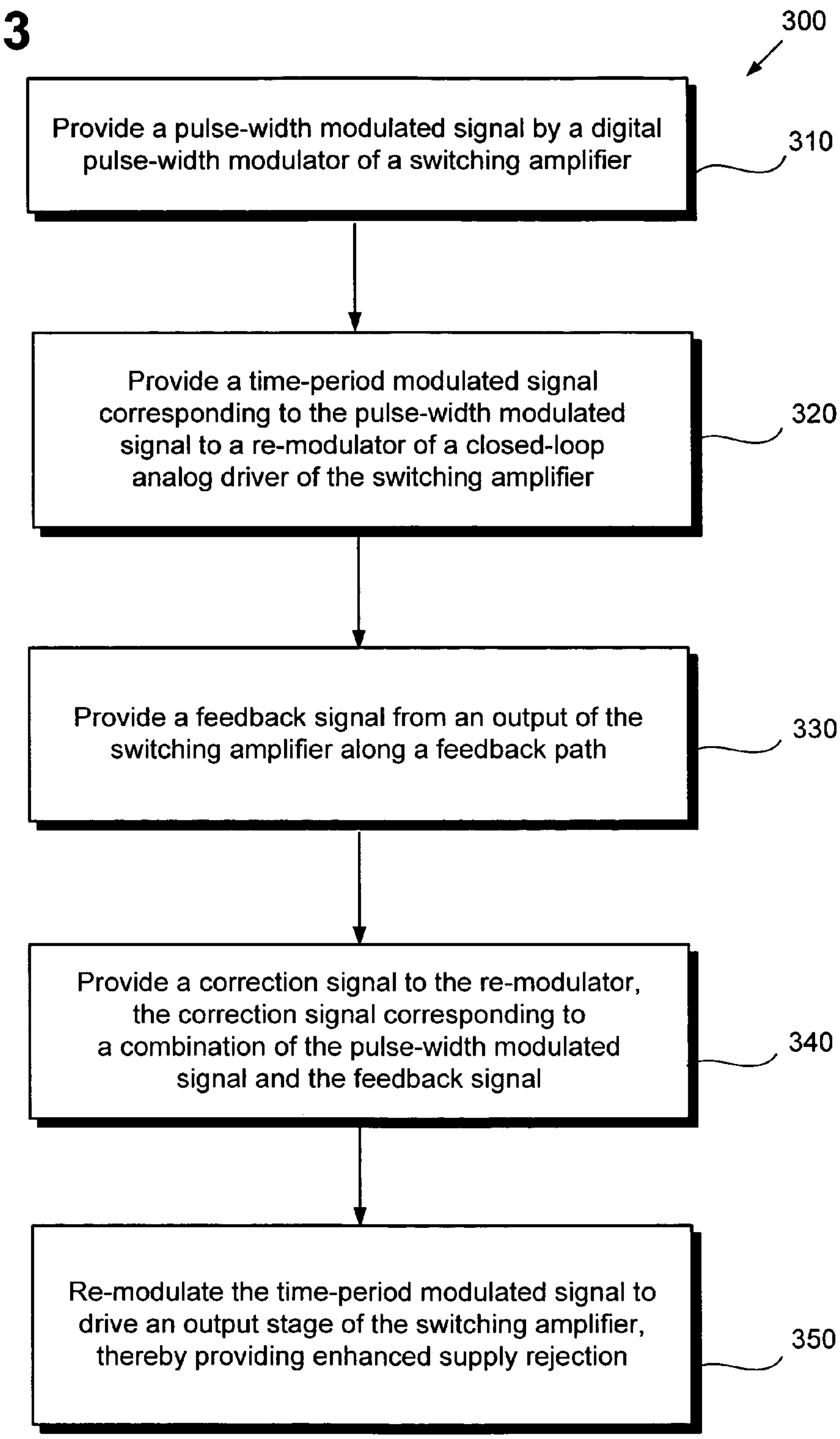
Figure 3
300
Provide a pulse-width modulated signal by a digital pulse-width modulator of a switching amplifier
310
Provide a time-period modulated signal corresponding to the pulse-width modulated signal to a re-modulator of a closed-loop analog driver of the switching amplifier
320
Provide a feedback signal from an output of the switching amplifier along a feedback path
330
Provide a correction signal to the re-modulator, the correction signal corresponding to a combination of the pulse-width modulated signal and the feedback signal
340
Re-modulate the time-period modulated signal to drive an output stage of the switching amplifier, thereby providing enhanced supply rejection
350

SWITCHING AMPLIFIER WITH ENHANCED SUPPLY REJECTION AND RELATED METHOD

BACKGROUND OF THE INVENTION

1. Field of the Invention

The present invention is generally in the field of electronic circuits and systems. More specifically, the present invention is in the field of amplifier circuits and systems.

2. Background Art

Switching power amplifiers, including Class-D amplifiers, provide efficient amplification, which may be particularly important for applications in which a battery is used as a power supply. Switching power amplifiers may also improve the efficiency or reduce the power of mobile communication devices, such as audio headsets and cellular telephones. Despite being potentially desirable, conventional switching audio amplifiers can pose serious shortcomings when implemented in mobile communication devices.

One shortcoming is that the analog driver of a conventional switching power amplifier is prone to power supply noise. Particularly in a mobile communication device such as a cellular telephone, in which the battery also powers radio frequency transmitters, power supply noise may seriously degrade the signal quality and undermine the potential benefits provided by use of a switching power amplifier. Another shortcoming is that a conventional switching power amplifier is not easily scalable with advancements in process technology. Moreover, a conventional switching power amplifier that supplies a high pulse rate signal consumes large amounts of dynamic power and can have its performance severely degraded by switching errors.

Accordingly, there is a need to overcome the drawbacks and deficiencies in the art by providing a switching amplifier architecture that is scalable with advances in process technology, displays enhanced supply rejection, and is suitable for implementation as an audio amplifier in a mobile communication device.

SUMMARY OF THE INVENTION

The present application is directed to a switching amplifier with enhanced supply rejection and related method, substantially as shown in and/or described in connection with at least one of the figures, as set forth more completely in the claims.

BRIEF DESCRIPTION OF THE DRAWINGS

FIG. 3 is a flowchart presenting a method for use by a switching amplifier to provide enhanced supply rejection, according to one embodiment of the present invention.

DETAILED DESCRIPTION OF THE INVENTION

Figure 1:
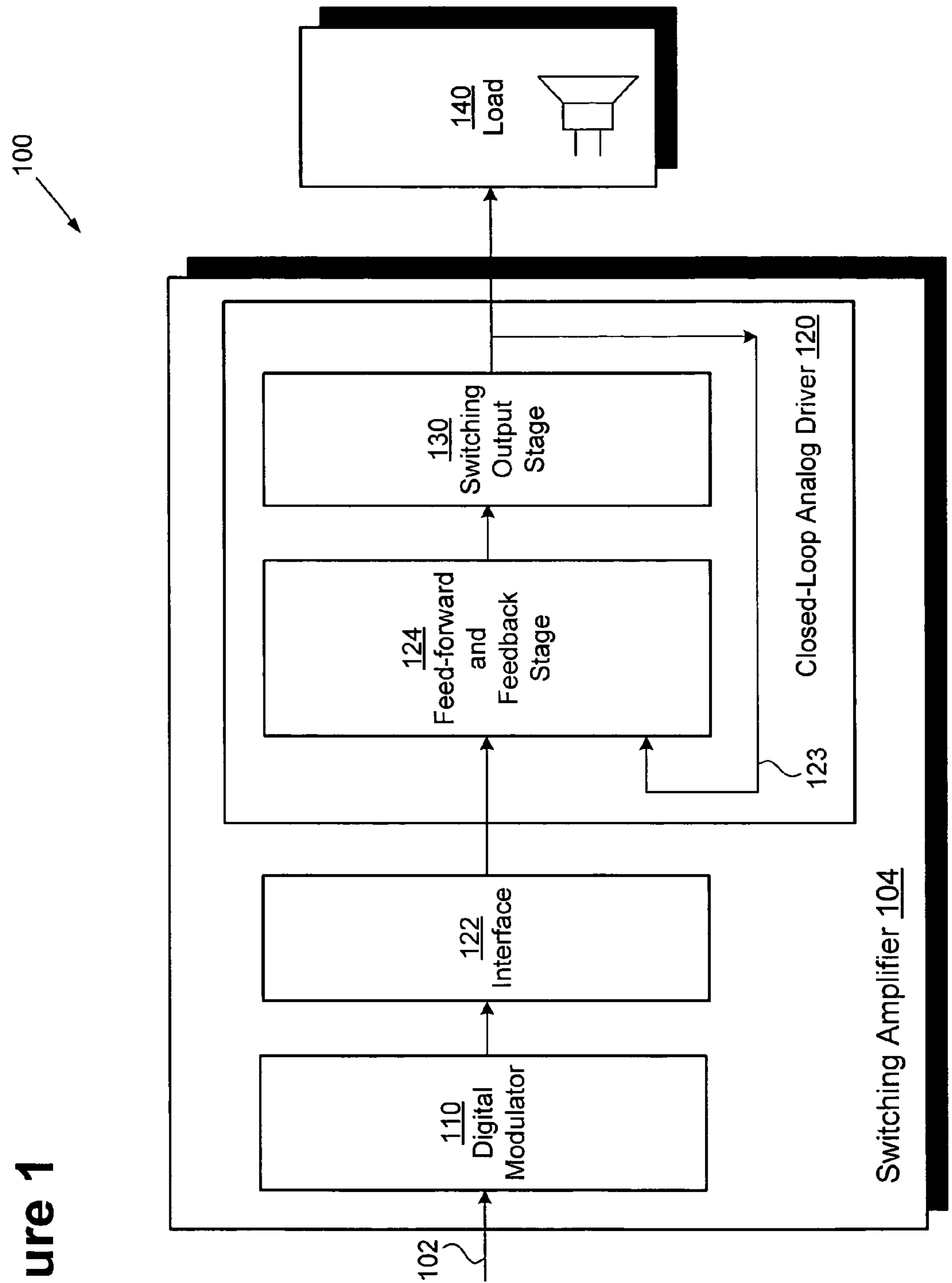
FIG. 1 shows a conceptual block diagram of an exemplary switching amplifier implemented as an audio amplifier, according to one embodiment of the present invention.

The present invention is directed to a switching amplifier with enhanced supply rejection and a related method.

Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals. Moreover, the drawings and illustrations in the present application are generally not to scale, and are not intended to correspond to actual relative dimensions.

Conventional switching power amplifier circuits pose several limitations when implemented in a mobile communication device. For example, the analog driver of a conventional switching power amplifier is sensitive to power supply noise. Power supply noise can be particularly pronounced in a mobile communication device like a cellular telephone, in which radio frequency transmitter operation can severely disturb the power supply. Moreover, expensive components like high-precision digital-to-analog converters (DACs) used to provide a high quality signal to a conventional switching power amplifier are often too costly for many mobile communications applications. Unfortunately, power supply noise can undermine the potential benefits of using switching power amplifiers in many mobile devices including cellular telephones and audio headsets.

Additionally, the analog driver of a conventional switching power amplifier is often difficult to integrate with digital processing circuitry, such as digital signal processing (DSP) circuitry. As such, a conventional switching power amplifier that uses an analog pulse width modulation (PWM) signal is often unable to finely compensate for errors in an analog driver. Moreover, an alternative conventional switching power amplifier architecture that uses a pulse-density modulation (PDM) signal often consumes large amounts of dynamic power and its performance is limited by switching errors. Additionally, it is often difficult to physically integrate the analog driver with corresponding digital circuitry into a semiconductor die, such as a transceiver baseband chip, used in many mobile devices such as cellular telephones and audio headsets.

Unlike conventional switching power amplifiers, embodiments of the present invention provide a switching power amplifier with enhanced supply rejection, reduced dynamic power consumption, reduced timing errors and an architecture that facilitates easy integration of an analog driver and digital processing circuitry onto the same semiconductor die. As a result, embodiments of the present invention are readily scalable with advances in fabrication process technology.

FIG. 1 shows a block diagram of communication system environment 100, which includes switching amplifier 104 according to one embodiment of the present invention. As shown in FIG. 1, switching amplifier 104 amplifies input signal 102 to a power level that is sufficient to supply load 140, shown as including an audio speaker in FIG. 1. Switching amplifier 104 may be a Class-D amplifier implemented as an audio amplifier within a mobile communication device, such as a cellular telephone, for example.

Switching amplifier 104 may comprise digital modulator 110, interface 122, and closed-loop analog driver 120 including feed-forward and feedback stage 124 and switching output stage 130. Digital modulator 110 may comprise digital processing circuitry, such as DSP circuitry, and may provide a modulated signal to closed-loop analog driver 120 through interface 122. Closed-loop analog driver 120 may utilize feed-forward and feedback stage 124 and feedback path 123 to provide switching output stage 130 with a drive signal. Using the drive signal, switching output stage 130 may provide an amplified signal to power load 140. Though not shown in FIG. 1, the amplified signal is typically characterized by high power supply noise rejection, low dynamic power consumption, and high fidelity, which is not degraded by switching errors. Load 140 may be a loudspeaker or a headset, for example. It is noted that FIG. 1 is a system flow block diagram. As such, the signaling amongst the system blocks are shown as simply as possible and are not intended to represent a particular signaling mode. For example, despite being shown as single lines, each of the signal paths represented in FIG. 1, as well as in subsequent FIG. 2, may comprise differential signals. Moreover, switching amplifier 104 may be configured to provide a differential output signal as the input to load 140. Alternatively, in other embodiments, switching amplifier 104 can be adapted to provide a single-ended output to load 140.

Consistent with FIG. 1, switching amplifier 104 may be fabricated to reside on one semiconductor die, which enables a compact and low cost implementation that may be highly desirable. In one embodiment, for example, switching amplifier 104 may be implemented together with other communications circuitry on a transceiver baseband chip. Moreover, as previously suggested, switching amplifier 104 may be implemented as an audio amplifier in a mobile communication device receiver, such as a cellular to telephone receiver, for example.

Figure 2:
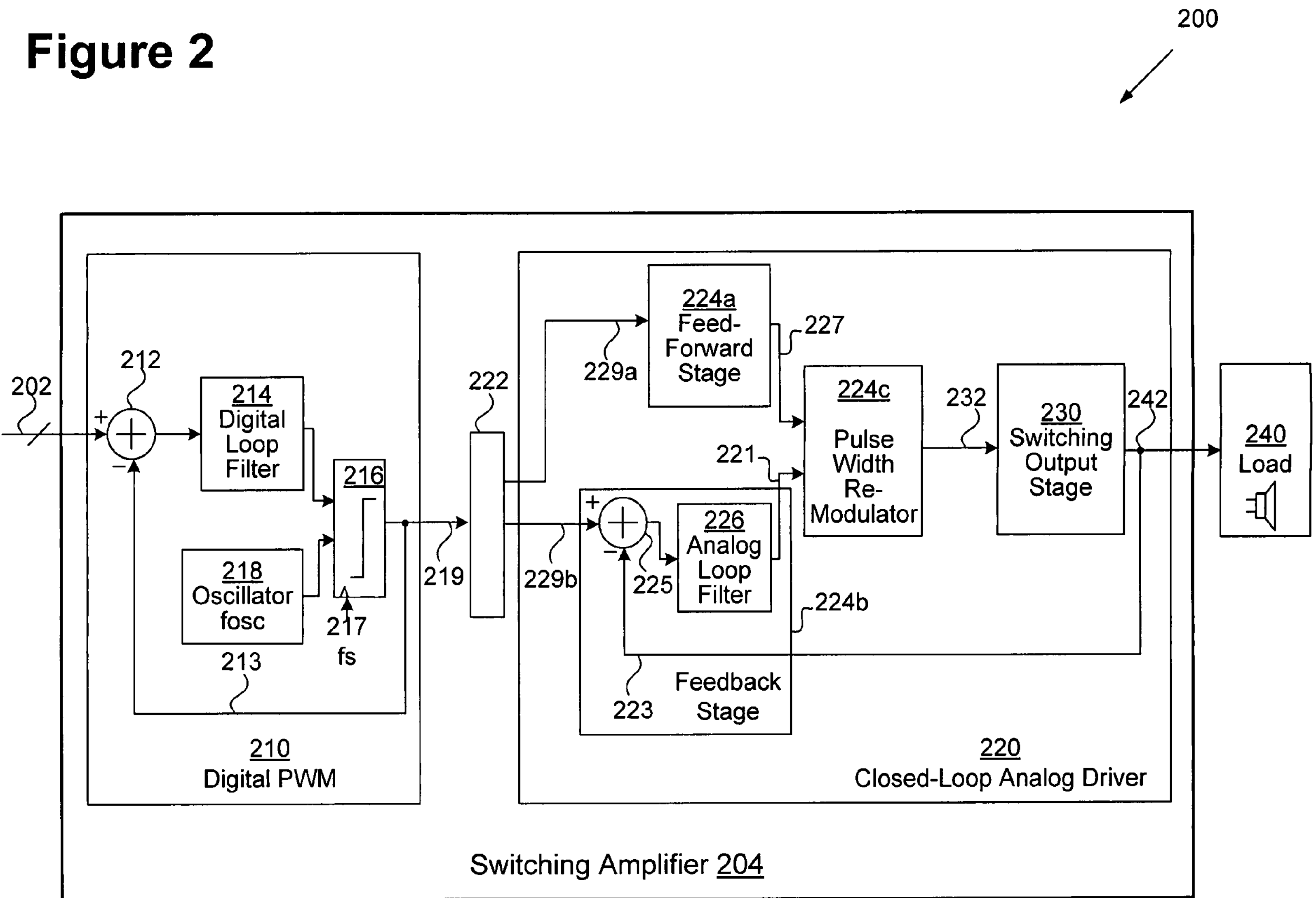
FIG. 2 is a conceptual block diagram showing a switching amplifier including exemplary digital modulator and closed-loop analog driver circuits, according to one embodiment of the present invention.

Referring to FIG. 2, communication system environment 200 corresponds to communication system environment 100, in FIG. 1, and can be seen to further describe the exemplary features depicted in that embodiment. As shown in FIG. 2, communication system environment 200 comprises switching amplifier 204 to amplify input signal 202 and provide amplified signal 242, which has the power level needed to drive load 240. Switching amplifier 204 may comprise digital PWM 210, interface 222, and closed-loop analog driver 220, corresponding respectively to digital modulator 110, interface 122, closed-loop analog driver 120, of switching amplifier 104, in FIG. 1. As further shown in FIG. 2, closed loop analog driver 220 includes switching output stage 230 corresponding to switching output stage 130, in FIG. 1, as well as feed-forward stage 224*a*, feedback stage 224*b* and pulse width re-modulator 224*c*, which collectively correspond to feed-forward and feedback stage 124, in FIG. 1.

Within switching amplifier 204, digital PWM 210 may internally include summer 212, digital loop filter 214, oscillator 218, and digital comparator 216 having clock rate 217. Digital modulator 210 may also include digital feedback loop 213 to correct errors in digital pulse-width modulated signal 219 that is provided to interface 222.

It is noted that although digital modulator 110 of FIG. 1 is characterized in FIG. 2 as digital PWM 210, more generally, digital modulation may be performed using any one of various modulation schemes, as known in the art. However, implementation of a digital PWM, such as digital PWM 210, as part of switching amplifier 204 can confer significant advantages. For example, digital implementation of the PWM modulator can provide digital pulse-width modulated signal 219 having a lower pulse rate, with reduced switching errors for increased performance. In addition, digital PWM 210 integrates some or all of the functionality of a high-resolution DAC, thereby enabling use of a simple re-timing circuit or a 1-bit DAC as interface 222, for example. Substitution of interface 222 for a high-resolution DAC can result in substantially reduced system cost.

Interface 222 may convert digital pulse-width modulated signal 219 provided by digital PWM 210 into analog pulse-width modulated signals, or simply into re-timed pulse-width modulated signals, for example, as represented by feed-forward modulated signal 229*a* and input modulated signal 229*b*. As noted above, interface 222 may be a DAC, but need not be a high-precision or high-resolution DAC. Instead, interface 222 may comprise a simple 1-bit DAC. Alternatively, interface 222 may be a simple retiming circuit for re-timing feed-forward modulated signal 229*a* and input modulated signal 229*b* relative to one another and/or to digital pulse-width modulated signal 219. In addition, interface 222 can be configured to introduce a signal delay to one or both of feed-forward modulated signal 229*a* and input modulated signal 229*b*. It is noted that the embodiment of FIG. 2 can be interpreted as representing feed-forward modulated signal 229*a* and input modulated signal 229*b* as different signals. However, despite possible timing and delay differences between feed-forward modulated signal 229*a* and input modulated signal 229*b*, both signals contain substantially the same content. Thus, more generally, and for the purposes of the present application, either or both of feed-forward modulated signal 229*a* and input modulated signal 229*b* can be characterized as modulated signal 229.

As shown in FIG. 2, interface 222 may supply modulated signal 229 to closed-loop analog driver 220 along two signal paths, e.g., a feed-forward signal path and a feedback signal path, as described below. In one embodiment of the present invention, the pulse rate of modulated signal 229, e.g., feed-forward modulated signal 229*a* and input modulated signal 229*b*, may be substantially less than clock rate 217 of digital PWM 210. Although in the illustrated embodiment, interface 222 is shown to be distinct from both digital PWM 210 and closed-loop analog driver 220, other embodiments may feature interface 222 within either of digital PWM 210 or closed-loop analog driver 220.

Turning to closed-loop analog driver 220, closed-loop analog driver 220 may include a feed-forward signal path, a feedback signal path, and a correction signal path. In the feed-forward signal path, feed-forward modulated signal 229*a* may be provided to feed-forward stage 224*a* to produce modulation signal 227 corresponding to modulated signal 229. Modulation signal 227, which may be a time-period re-modulated signal, for example, may be input into pulse-width re-modulator 224*c*. As shown in FIG. 2, feed-forward stage 224*a* may be coupled to a first input of pulse width re-modulator 224*c*. Feed-forward stage 224*a* may internally include an analog ramp signal generator. Pulse-width re-modulator 224*c* may comprise a comparator and a phase detector, for example.

As a specific example of the foregoing, feed-forward stage 224*a* may comprise first and second analog ramp generators for producing first and second ramp signals as components of modulation signal 227, which may itself take the form of an analog triangular wave or saw tooth wave. According to that example, pulse-width re-modulator 224*c* might include first and second comparators for receiving the respective first and second ramp signals. Moreover, in the same example, modulation signal 227 may be time-period modulated according to the zero crossings of the first and second ramp signals. It is noted that although FIG. 2 characterizes re-modulation as being performed specifically by pulse-width re-modulator 224*c*, more generally, modulation signal 227 is provided to a re-modulator, which may employ a modulation scheme other than pulse-width modulation.

Returning to the representation of switching amplifier 204 shown in FIG. 2, the feedback signal path of closed-loop analog driver 220 may comprise a feedback path that returns feedback signal 223 to feedback stage 224*b* from the output of switching amplifier 204. As shown, feedback signal 223 may be combined with modulated signal 229, e.g., input modulated signal 229*b*, by summer 225.

The correction signal path of closed-loop analog driver 220 may include analog loop filter 226 coupled to a second input of pulse-width re-modulator 224*c*. Analog loop filter 226 may function as an integrator, for example, and provides correction signal 221 to pulse-width re-modulator 224*c*.

The design of switching amplifier 204 lends itself to a variety of different fabrication strategies enabling optimization of switching amplifier 204 for the particular operating environment and cost or performance constraints associated with its anticipated use. For example, as previously mentioned in conjunction with FIG. 1, in one embodiment, switching amplifier 204 can be fabricated to reside on one semiconductor to die, which enables a compact and low cost implementation that may be highly desirable for some mobile applications.

Alternatively, for applications in which high-performance operation is required, switching amplifier 204 may be implemented on more than one semiconductor die, such as by being distributed over two semiconductor dies, for instance. As an example of this is latter approach, digital PWM 210 could be fabricated on a first semiconductor die using an advanced fine geometry complementary metal-oxide-semiconductor (CMOS) process well suited for low-voltage digital circuitry, while closed-loop analog driver 220 could be fabricated on a second semiconductor die using a high-voltage process suitable for driving high output voltage swing, where relatively high speaker power is required.

Moreover, depending on the desired implementation, interface 222 can be situated on either of the two semiconductor dies so as to mediate passage of an interface signal from digital PWM 210 to closed-loop analog driver 220. For example, in one such embodiment, digital interface 222 may be situated on the low-voltage die occupied by digital PWM 210, in which case modulated signal 229 would represent the interface signal provided from the low-voltage die to the high-voltage die occupied by closed-loop analog driver 220. However, in another embodiment, digital interface 222 may be situated on the high-voltage die occupied by closed-loop analog driver 220, in which case digital pulse-width modulated signal 219 would represent the interface signal provided from the low-voltage die occupied of digital PWM 210 to the high-voltage die of closed-loop analog driver 220.

Figure 4:
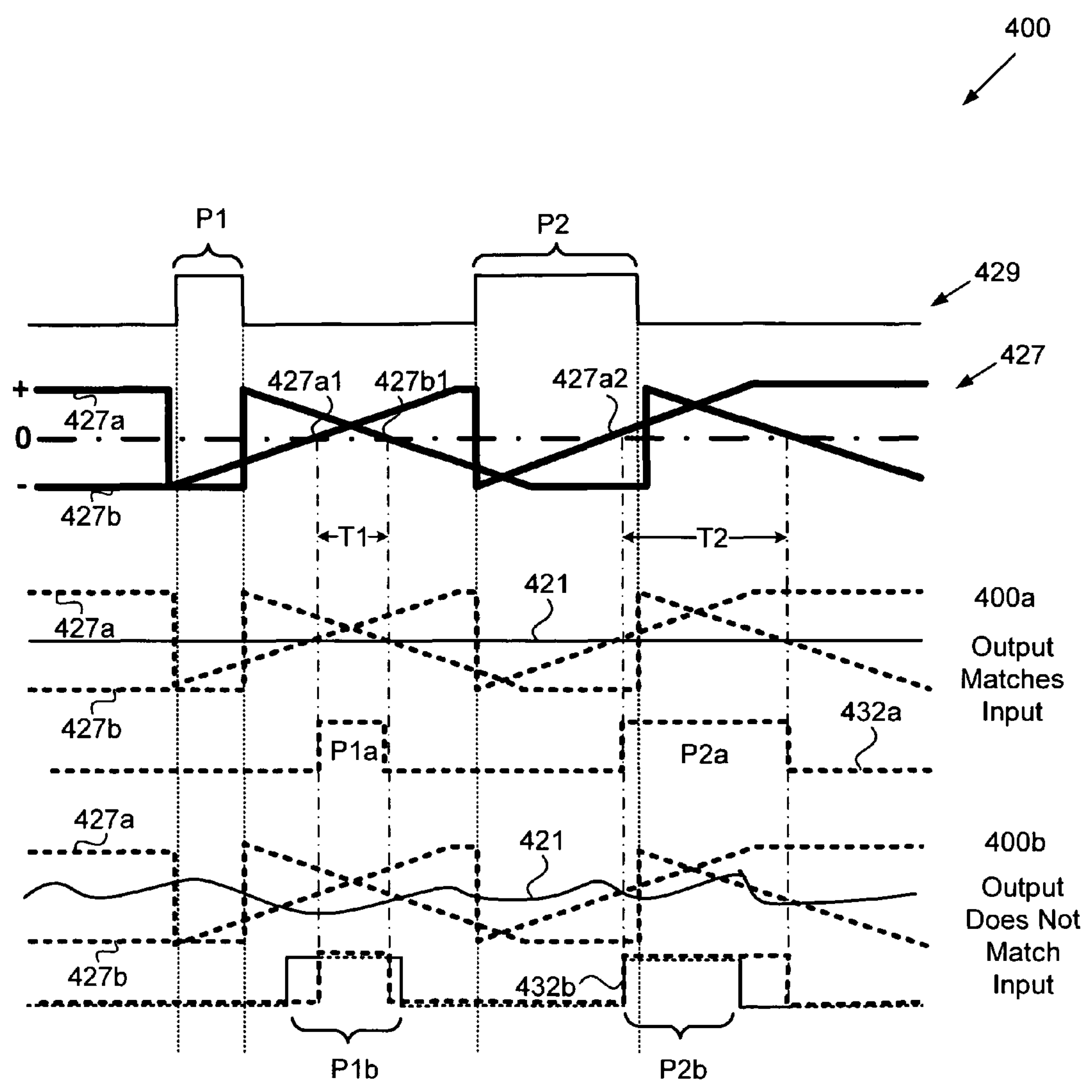
FIG. 4 is a timing diagram providing a conceptual overview of generation of a time-period modulated modulation signal for use by a switching amplifier displaying enhanced supply rejection, according to one embodiment of the present invention.

The exemplary embodiments of switching amplifiers 104 and 204 shown in respective FIGS. 1 and 2 will be further described by reference to FIGS. 3 and 4. FIG. 3 shows flowchart 300, which describes the steps, according to one embodiment of the present invention, of a method for use by a switching amplifier to enhance supply rejection, while FIG. 4 is a timing diagram providing a conceptual overview of generation of a time-period modulated modulation signal, such as modulation signal 227, in FIG. 2, for example. With respect to the method outlined in FIG. 3, it is noted that certain details and features have been left out of flowchart 300 that are apparent to a person of ordinary skill in the art. For example, a step may comprise one or more substeps as known in the art. While steps 310 through 350 indicated in flowchart 300 are sufficient to describe one embodiment of the present invention, other embodiments of the invention may utilize steps different from those shown in flowchart 300.

Referring to step 310 of flowchart 300, step 310 comprises providing a pulse-width modulated signal by a digital modulator of a switching amplifier. As shown in FIG. 2, digital PWM 210 within switching amplifier 204 may provide digital pulse-width modulated signal 219 as an output from digital PWM 210. It is noted that although the embodiment of flowchart 300 characterizes the signal provided in step 310 as a pulse-width modulated signal, more generally the signal may be any suitably modulated signal produced by the digital modulator implemented in a switching amplifier, such as switching amplifier 204, in FIG. 2.

Digital PWM 210 may condition digital pulse-width modulated signal 219 to improve amplifier performance and efficiency. Thus, within digital PWM 210, digital loop filter 214, oscillator 218, digital comparator 216 and summer 212 may transform input signal 202, such as a digital input signal, into a digital PWM signal, such as digital pulse-width modulated signal 219. Digital loop filter 214, oscillator 218, digital comparator 216, and summer 212 may also ensure that digital pulse-width modulated signal 219 accurately represents the information within digital input signal 202. For example, digital loop filter 214 may incorporate spectral shaping to improve the quality of digital pulse-width modulated signal 219. Digital loop filter 214 may further include circuitry to stabilize digital PWM 210 over a wide range of input frequencies.

Moreover, digital PWM 210 may limit the dynamic power consumption of switching amplifier 204 by keeping the pulse rate of digital pulse-width modulated signal 219 at a rate much less than the clock rate 217 of digital PWM 210. For example, modulation rate "fosc" of oscillator 218 may be twenty or thirty times smaller than clock rate 217. In some embodiments, the pulse rate of digital pulse-width modulated signal 219 may be less than approximately 1 MHz (one megahertz) when clock rate 217 is approximately 24 MHz (twenty-four megahertz). A lowered pulse rate digital modulated signal consumes less dynamic power, especially when compared to dense, high frequency pulse streams such as typical PDM signals. Embodiments of the present invention may also employ a non-PWM digital modulator that is stable over a wide range of frequencies and does not dissipate large amounts of dynamic power.

Digital modulator 210 may provide digital pulse-width modulated signal 219 to interface 222. Interface 222 may convert the digital pulse-width modulated signal to an analog modulated signal to form modulated signal 229. In one embodiment, by incorporating the functionality of a high-resolution DAC as part of its operation, digital PWM 210 can be configured to provide what is effectively a pulse-width modulated analog signal as an output. In one such embodiment, interface 222 may comprise a simple retiming circuit to provide re-timed feed-forward modulated signal 229*a* and re-timed and delayed input modulated signal 229*b* as inputs to closed-loop analog driver 220.

Returning to flowchart 300 in FIG. 3, step 320 of flowchart 300 comprises providing a time-period modulated modulation signal corresponding to the pulse-width modulated signal to a re-modulator of a closed-loop analog driver of the switching amplifier. As shown in FIG. 2, feed-forward stage 224*a* may provide modulation signal 227 to pulse-width re-modulator 224*c*. Internally, feed-forward stage 224*a* may supply a modulation to feed-forward modulated signal 229*a* by generating an analog ramp signal using a ramp generator, for example, and producing a time-period modulated signal as modulation signal 227. Modulation signal 227 may then be provided to pulse-width re-modulator 224*c*, which as discussed above, may be implemented using a comparator and a phase detector in one embodiment of the present invention.

Referring to FIG. 4, timing diagram 400 in that Figure provides an example of the aforementioned process steps. Trace 429 showing a pulse-width modulated signal having pulses P1 and P2 may be seen to correspond to feed-forward modulated signal 229*a*, in FIG. 2. Returning to the previously described specific example in which feed-forward stage 224*a* includes first and second analog ramp generators for producing first and second analog ramp signals as components of modulation signal 227, trace 427 can be seen to correspond to a modulation signal including distinct ramping components. As shown in FIG. 4, trace 427 includes ramp signals 427*a* and 427*b*. As may be apparent from FIG. 4, modulation signal 427 is a time-period modulated signal, having that time-period modulation imposed according to the zero crossings of ramp signals 427*a* and 427*b*. Thus, a first time-period modulation may correspond to T1, the interval between the first ramp signal 427*a* zero crossing at 427*a*1 and the corresponding first zero crossing of ramp signal 427*b* at 427*b*1. Similarly, the time-period modulation corresponding to T2 is determined by the interval between the second zero crossing of ramp signal 427*a* at 427*a*2 and the corresponding second zero crossing of ramp signal 427*b* at 427*b*2, and so forth.

Continuing with step 330 of flowchart 300 in FIG. 3, step 330 comprises providing a feedback signal from an output of the switching amplifier along a feedback path. Returning to FIG. 2, feedback signal 223 may be provided from the output of switching amplifier 204. As shown, feedback signal 223 may be returned to summer 225 of feedback stage 224*b*.

Moving to step 340 in FIG. 3, step 340 of flowchart 300 comprises providing a correction signal to the re-modulator, the correction signal corresponding to a combination of the modulated signal, e.g., input modulated signal 229*b*, and feedback signal 223. As shown in FIG. 2, analog loop filter 226 may provide correction signal 221 to pulse-width re-modulator 224*c*. Correction signal 221 may comprise a combination of modulated signal 229 and feedback signal 223. For example, correction signal 221 may include a difference of modulated signal 229, e.g., input modulated signal 229*b*, and feedback signal 223 taken at summer 225. In one embodiment of the present invention, analog loop filter 226 may comprise an integrator. Thus, correction signal 221 may comprise a difference, an integrated difference, or another combination of modulated signal 229 and feedback signal 223.

Continuing to step 350 of flowchart 300, step 350 comprises re-modulating the modulation signal, such as a time-period modulated signal, to drive an output stage of the switching amplifier, thereby providing enhanced supply rejection. As shown in FIG. 2, pulse-width re-modulator 224*c* may produce drive signal 232, which may be a pulse-width modulated signal, by re-modulating modulation signal 227 with the value of correction signal 221 so as to fine tune the drive signal to correct for errors introduced by, for example, power supply noise. Drive signal 232 may then drive switching output stage 230, producing amplified signal 242 with the large amplitude necessary to power load 240. For example, pulse-width re-modulator 224*c* may compare modulation signal 227, a coarse representation of modulated signal 229, e.g., feed-forward modulated signal 229*a*, against correction signal 221, a representation of supply noise and other errors within amplified signal 242. Pulse width re-modulator 224*c* may further adjust pulse widths in drive signal 232 to adequately compensate for the supply noise represented by correction signal 221. As such, closed-loop analog driver 220 may enable enhanced supply rejection.

Referring once again to FIG. 4, the traces shown in examples 400*a* and 400*b* illustrate the re-modulation performed by pulse-width re-modulator 224*c*, in FIG. 2. Example 400*a* depicts the case in which the output of switching amplifier 204 matches the modulated input. Trace 421 represents correction signal 221 provided by analog loop filter 226, in FIG. 2. As may be apparent by reference to FIGS. 2 and 4, when feedback signal 223 is substantially free of errors, the difference between feedback signal 223 and input modulated signal 229*b* is substantially zero. As a result, correction signal trace 421 is a constant line having substantially no effect on the time-period modulated modulation signal corresponding to traces 427*a* and 427*b*. Consequently, drive signal trace 432*a*, corresponding to drive signal 232 in FIG. 2, includes pulses P1*a* and P2*a*, which are time shifted, but otherwise have pulse widths substantially unchanged from respective pulses P1 and P2 in trace 429.

By contrast, example 400*b* depicts the case in which the output of switching amplifier 204 does not match the modulated input. Trace 421 once again represents correction signal 221, however, in this case feedback signal 223 contains errors, and the difference between feedback signal 223 and input modulated signal 229*b* is a reflection of those errors. As a result, pulse-width re-modulator 224*c* re-modulates the time-period modulated modulation signal corresponding to traces 427*a* and 427*b*. Consequently, drive signal trace 432*b* includes re-modulated pulses P1*b* and P2*b* to correct for the errors detected in the output signal of switching amplifier 204 via feedback signal 223.

Thus, the present application discloses a switching amplifier with enhanced supply rejection and a related method. The switching amplifier of the present invention overcomes critical shortcomings limiting the conventional use of switching power amplifiers in mobile devices such as cellular telephones. For example, the switching amplifier of the present invention provides enhanced supply rejection and provides performance that is not badly degraded by large battery voltage disturbances that do degrade the signal quality of conventional analog drivers used in many mobile devices. In one embodiment, the switching amplifier of the present invention features a closed-loop analog driver with a feed-forward path in combination with a digital modulator. Embodiments of the present switching amplifier disclosed herein can by readily integrated with digital processing circuitry and are therefore scalable with advances in process technology. Accordingly, the switching amplifier of the present invention can be fabricated on a semiconductor die, such as a baseband transceiver chip, that also contains digital processing circuitry.

From the above description, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A switching amplifier having an enhanced supply rejection, said switching amplifier comprising:

a digital modulator to provide a modulated signal;

a closed-loop analog driver coupled to said digital modulator;

said closed-loop analog driver comprising a feedback path providing a feedback signal from an output of said switching amplifier, said feedback path comprising a summer to combine said modulated signal and said feedback signal;

said closed-loop analog driver configured to re-modulate a modulation signal corresponding to said modulated signal to drive an output stage of said switching amplifier, thereby providing said enhanced supply rejection.

2. The switching amplifier of claim 1, wherein said digital modulator comprises a digital pulse-width modulator.

3. The switching amplifier of claim 1, wherein said closed-loop analog driver comprises:

a feed-forward stage coupled to an input of a re-modulator, said feed-forward stage providing said modulation signal to said re-modulator;

an analog loop filter coupled to another input of said re-modulator, said analog loop filter providing a correction signal to said re-modulator, said correction signal corresponding to a combination of said modulated signal and said feedback signal.

4. The switching amplifier of claim 1, wherein said switching amplifier is fabricated on one semiconductor die.

5. The switching amplifier of claim 4, wherein said one semiconductor die comprises a transceiver baseband chip.

6. The switching amplifier of claim 1, further comprising an interface coupling said closed-loop analog driver to said digital modulator.

7. The switching amplifier of claim 6, wherein said interface is a digital-to-analog converter (DAC).

8. The switching amplifier of claim 1, wherein said modulated signal has a pulse rate that is substantially less than a clock rate of said digital modulator.

9. The switching amplifier of claim 1, wherein said switching amplifier is implemented as an audio amplifier in a mobile communication device.

10. A method for use by a switching amplifier to provide an enhanced supply rejection, said method comprising:

providing a modulated signal by a digital modulator of said switching amplifier;

providing a modulation signal corresponding to said modulated signal to a re-modulator of a closed-loop analog driver of said switching amplifier;

providing a feedback signal from an output of said switching amplifier along a feedback path;

providing a correction signal to said re-modulator, said correction signal corresponding to a combination of said modulated signal and said feedback signal provided by a summer in said feedback path;

re-modulating said modulation signal to drive an output stage of said switching amplifier, thereby providing said enhanced supply rejection.

11. The method of claim 10, wherein providing said correction signal comprises delaying said modulated signal and taking a difference between the delayed modulated signal and said feedback signal.

12. The method of claim 10, wherein said digital modulator is a digital pulse-width modulator.

13. The method of claim 10, wherein said modulated signal has a pulse rate that is substantially less than a clock rate of said digital modulator.

14. The method of claim 10, wherein providing said modulation signal to said re-modulator comprises comparing said modulation signal against said correction signal.

15. The method of claim 10, wherein said modulation signal comprises a ramp signal.

16. The method of claim 10, wherein said providing said correction signal comprises integrating a difference between said modulated signal and said feedback signal.

17. The method of claim 10, wherein re-modulating said modulation signal comprises comparing said modulation signal and said correction signal.

18. The method of claim 10, wherein said switching amplifier is fabricated on one semiconductor die.

19. The method of claim 18, wherein said one semiconductor die comprises a transceiver baseband chip.

20. The method of claim 10, wherein said switching amplifier is implemented as an audio amplifier in a mobile communication device.

* * * * *